United States Patent
Van Der Laan et al.

(10) Patent No.: US 8,134,683 B2
(45) Date of Patent: Mar. 13, 2012

(54) DEVICE MANUFACTURING METHOD, COMPUTER PROGRAM AND LITHOGRAPHIC APPARATUS

(75) Inventors: Hans Van Der Laan, Veldhoven (NL); Laurentius Cornelius De Winter, Vessem (NL)

(73) Assignee: ASML Netherlands B.V., Veldhoven (NL)

( * ) Notice: Subject to any disclaimer, the term of this patent is extended or adjusted under 35 U.S.C. 154(b) by 1245 days.

(21) Appl. No.: 11/704,374

(22) Filed: Feb. 9, 2007

(65) Prior Publication Data

US 2008/0192217 A1    Aug. 14, 2008

(51) Int. Cl.
*G03B 27/42* (2006.01)
(52) U.S. Cl. ............... 355/53; 355/52; 355/55; 355/57; 355/67; 355/401
(58) Field of Classification Search .................. 355/52, 355/53, 55, 57, 67, 401
See application file for complete search history.

(56) References Cited

U.S. PATENT DOCUMENTS

| 2003/0047694 | A1* | 3/2003 | Van Der Laan ............... 250/548 |
| 2005/0254024 | A1 | 11/2005 | Van Greevenbroek et al. |
| 2006/0114437 | A1 | 6/2006 | Akhssay et al. |
| 2007/0296938 | A1* | 12/2007 | Tel et al. .......................... 355/53 |

FOREIGN PATENT DOCUMENTS

| EP | 1286223 A1 | 2/2003 |
| JP | 08-096014 | 4/1996 |
| JP | 2000-012434 | 1/2000 |
| JP | 2003-215424 | 7/2003 |
| JP | 2004-317507 | 11/2004 |
| JP | 2005-311020 | 11/2005 |

OTHER PUBLICATIONS

Japanese Office Action mailed Nov. 11, 2010 in corresponding Japanese patent application No. 2008-022379.

* cited by examiner

*Primary Examiner* — Edward Glick
*Assistant Examiner* — Mesfin T Asfaw
(74) *Attorney, Agent, or Firm* — Pillsbury Winthrop Shaw Pittman LLP

(57) ABSTRACT

In a lithographic projection apparatus, adjustment of the projection system, e.g. to compensate for lens heating effects, is performed by determining a region of interest for a given pattern and illumination arrangement, the region of interest being a non-circular region of a pupil plane of the projection system through which substantially all of the radiation of the modulated beam that contributes to formation of the image passes; obtaining a set of basis functions that are orthogonal over the region of interest; expressing the wavefront in the pupil plane in terms of the basis functions that are orthogonal over the region of interest and a set of coefficients; and determining a value of a control setting to minimize the values of the coefficients.

15 Claims, 3 Drawing Sheets

DEVICE MANUFACTURING METHOD, COMPUTER PROGRAM AND LITHOGRAPHIC APPARATUS

FIELD

The present invention relates to a method for manufacturing a device, a computer program and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A projection lithography apparatus uses a projection optical system to project an image of the pattern onto the substrate. The image projected onto the substrate, and hence the device manufactured, is sensitive to various forms of error that may be caused by aberrations in the projection system. Since the projection system is inevitably not 100% transmissive and the power level of the projection beam is high in order to provide short exposure times and hence high throughput, the projection system absorbs a significant amount of energy from the projection beam and heats up. In spite of highly effective cooling systems, heating of elements of the projection system is sufficient to distort them and introduction of aberrations can occur. This phenomenon is often referred to as lens heating. Illumination modes are usually described in terms of the intensity distribution of the radiation beam in a pupil plane of the projection system. Common illumination modes include: conventional illumination, in which the radiation beam is contained uniformly in a central disc in the pupil plane; dipole illumination, in which the radiation beam is contained in two poles located away from the optical axis of the illuminator; annular, in which the radiation beam is contained in an annulus concentric to the optical axis; and quadrupole illumination, in which the beam is contained in four off-axis poles. Dipole and quadrupole illumination modes in particular result in strong localization of the radiation beam in the projection system and hence to localized heating.

It is known to provide adjustable elements in a projection system to compensate for aberrations caused by lens heating, which can in many cases be predicted using software. Aberrations in an optical system are often described in terms of Zernike polynomials which are a set of orthogonal basis functions particularly useful to describing functions having some degree of rotational symmetry. It is therefore known to provide adjustable elements that can effect an adjustment affecting aberrations.

However, existing arrangements for compensating for aberrations induced by lens heating are not particularly effective when used with strongly localized illumination modes such as dipole and conventional illumination with small sigma (pupil filling) values.

SUMMARY

It is desirable, for example, to provide improved arrangements for compensating for aberrations caused by heating of a projection system, especially when a highly-localized illumination mode is used.

According to an aspect of the invention, there is provided a device manufacturing method using a lithographic apparatus comprising:

an illuminator configured to illuminate a patterning device with a radiation beam having an illumination arrangement, and a projection system configured to project radiation in a modulated beam to form an image of the pattern onto a substrate, the projection system having a pupil plane and an adjustable element configured to adjust an aberration of the projection system in response to a control setting, the method comprising:

receiving information regarding the pattern and the illumination arrangement;

determining a region of interest based on the information regarding the pattern and the illumination arrangement, the region of interest being a non-circular region of the pupil plane through which substantially all of the radiation of the modulated beam that contributes to formation of the image passes;

obtaining a set of basis functions that are orthogonal over the region of interest;

expressing the wavefront in the pupil plane in terms of the basis functions that are orthogonal over the region of interest and a set of coefficients; and determining a value of the control setting to minimize the values of the coefficients.

According to an aspect of the invention, there is provided a device manufacturing method using a lithographic apparatus comprising:

an illuminator configured to illuminate a patterning device with a radiation beam having an illumination arrangement, and a projection system configured to project radiation in a modulated beam to form an image of the pattern onto a substrate, the projection system having a pupil plane and an adjustable element configured to adjust an aberration of the projection system in response to a control setting, the method comprising:

receiving information regarding the pattern and the illumination arrangement;

determining a region of interest based on the information regarding the pattern and the illumination arrangement, the region of interest being a non-circular region of the pupil plane through which substantially all of the radiation of the modulated beam that contributes to formation of the image passes;

determining a weighting function for the pupil plane, the weighting function weighting the region of interest higher than parts of the pupil plane not in the region of interest;

obtaining a set of basis functions that are orthogonal over the weighted pupil plane;

expressing the wavefront in the pupil plane in terms of the basis functions that are orthogonal over the weighted pupil plane and a set of coefficients; and determining a value of the control setting to minimize the values of the coefficients.

According to an aspect of the invention, there is provided a computer program arranged to determine a value for a control setting for a device manufacturing method using a lithographic apparatus comprising:

an illuminator configured to illuminate a patterning device with a radiation beam having an illumination arrangement, and a projection system configured to project radiation in a modulated beam to form an image of the pattern onto a substrate, the projection system having a pupil plane and an adjustable element configured to adjust an aberration of the projection system in response to a control setting, the computer program comprising instructions recorded on a computer-readable medium to instruct a computer system to perform a method comprising:

receiving information regarding the pattern and the illumination arrangement;

determining a region of interest based on the information regarding the pattern and the illumination arrangement, the region of interest being a non-circular region of the pupil plane through which substantially all of the radiation of the modulated beam that contributes to formation of the image passes;

obtaining a set of basis functions that are orthogonal over the region of interest;

expressing the wavefront in the pupil plane in terms of the basis functions that are orthogonal over the region of interest and a set of coefficients; and determining a value of the control setting to minimize the values of the coefficients.

According to an aspect of the invention, there is provided a lithographic apparatus comprising:

an illuminator configured to illuminate a patterning device with a radiation beam having an illumination arrangement;

a projection system configured to project radiation in a modulated beam to form an image of the pattern onto a substrate, the projection system having a pupil plane and an adjustable element configured to adjust an aberration of the projection system in response to a control setting; and a control system comprising:

an input device arranged to receive information regarding the pattern and the illumination arrangement, a first calculating device arranged to determine a region of interest based on the information regarding the pattern and the illumination arrangement, the region of interest being a non-circular region of the pupil plane through which substantially all of the radiation of the modulated beam that contributes to formation of the image passes, a second calculating device arranged to obtain a set of basis functions that are orthogonal over the region of interest, a third calculating device arranged to express the wavefront in the pupil plane in terms of the basis functions that are orthogonal over the region of interest and a set of coefficients, and a fourth calculating device arranged to determine a value of the control setting to minimize the values of the coefficients.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
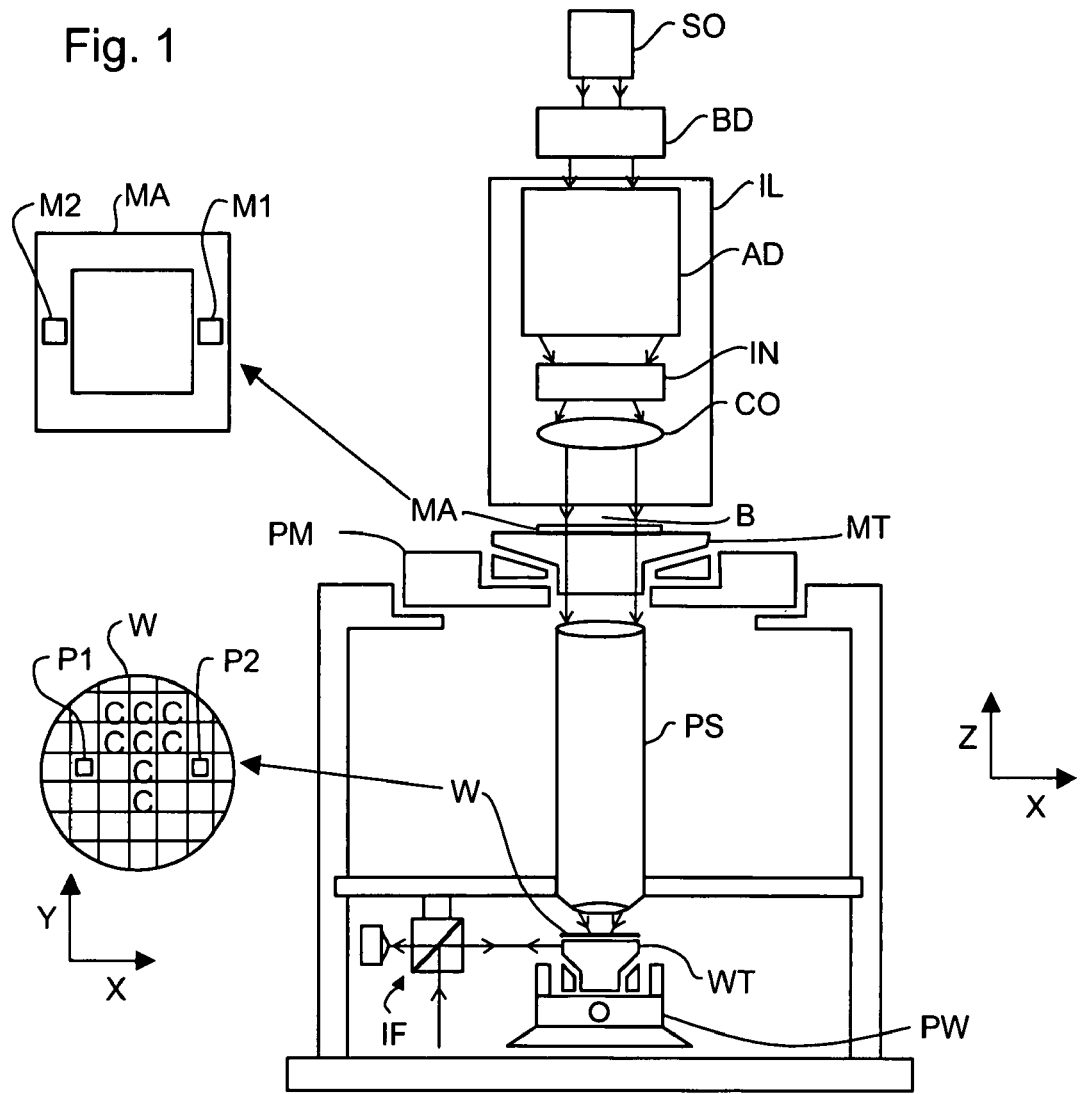
FIG. 1 depicts a lithographic apparatus according to an embodiment of the invention.

FIG. 1 schematically depicts a lithographic apparatus according to one embodiment of the invention. The apparatus comprises:

an illuminator (illumination system) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illuminator may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The apparatus of FIG. 1 desirably employs Kohler illumination. Thus, the illumination and projection systems IL, PS are arranged such that a pupil plane PP-IL in the illuminator, which is a Fourier transform of the object plane (containing patterning device MA), is imaged onto a pupil plane PP-PS in the projection system, which is a Fourier transform of the image plane (containing substrate W). With this arrangement, position in the pupil plane PP-IL corresponds to angle in the object plane and a desired illumination mode can be set up by arranging a suitable intensity distribution in the pupil plane PP-IL.

Figure 2:
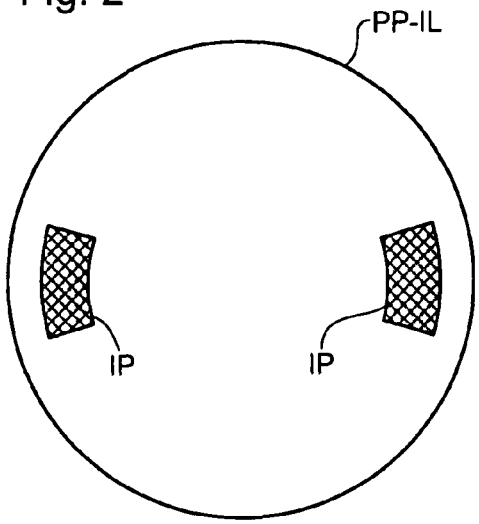
FIG. 2 depicts a dipole illumination mode.

FIG. 2 depicts an example of an intensity distribution in the pupil plane PP-IL in a dipole illumination mode. The energy of the radiation beam in such a mode is concentrated in two poles IP placed symmetrically either side of and spaced from the optical axis of the illuminator IL. With this mode, the radiation arrives at each point in the illumination field on the patterning device in two cones inclined to the normal. Such a mode is useful for exposing images comprising predominantly, or in which the critical features are, lines extending in a single direction perpendicular to the line joining the centers of the poles of the illumination distribution.

Figure 3:
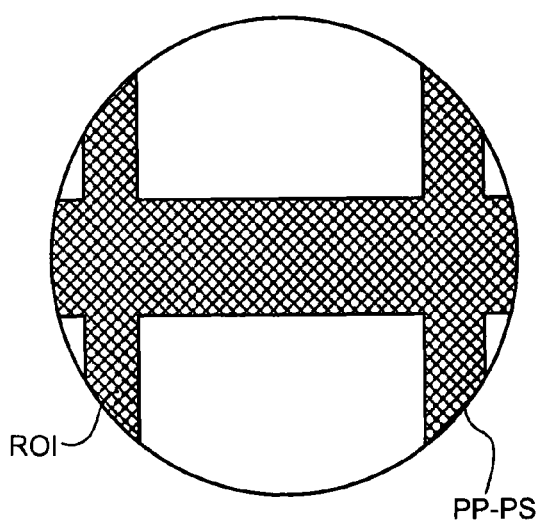
FIG. 3 depicts a region of interest in the pupil plane of a projection system for a pattern having lines in orthogonal directions illuminated by an illumination mode such as shown in FIG. 2.

When an illumination mode in which the beam energy is strongly localized in the pupil plane PP-IL is used, the pupil plane PP-PS of the projection system is not uniformly filled with radiation that contributes to imaging. The part of the pupil plane PP-PS that contains radiation that contributes to imaging is referred to herein as the region of interest. By way of an example, the region of interest ROI for the illumination mode of FIG. 2 when used to illuminate a pattern comprising lines extending horizontally and vertically is shown in FIG. 3. In general, the exact form of the region of interest depends on both the illumination mode and the pattern to be imaged. Not all radiation that passes through the projection system contributes to imaging—some may be blocked by an aperture stop and some radiation, e.g. the zeroth diffraction order, may simply provide a background illumination, sometimes referred to as the DC component, which is undesirable as it reduces contrast in the image but generally cannot be avoided. Radiation that contributes to imaging is radiation that reaches the substrate and interferes to form an image of the pattern. Thus parts of the pupil plane PP-PS outside the region of interest are not necessarily dark. It should also be appreciated that although in FIG. 3 the region of interest is shown as a single contiguous region it may in other cases be made up of several discrete parts.

According to an embodiment of the present invention, in a given lithographic exposure process at least one setting for at least one adjustable element AE in the projection system PS is calculated, the setting(s) being such that wavefront errors in the pupil plane PP-PS are minimized, taking into account the lens heating effects to be expected, using a weighting function that weights the region of interest ROI higher that the rest of the pupil plane PP-PS. Desirably, the parts of the pupil plane PP-PS outside the region of interest ROI are given a zero weighting. This enables a better optimization of the wavefront thereby improving imaging quality and enlarging the process window.

As mentioned, the exact region of interest for a given lithographic exposure process depends on the illumination mode and the pattern to be imaged. It can be determined using a software model of the optical system of the lithographic apparatus. However, the benefits of an embodiment of the present invention do not require the use of a region of interest that precisely corresponds to the region of the pupil plane through which all radiation contributing to imaging passes. If the region of interest used includes areas through which no radiation contributing to imaging passes there will be some loss of the benefit to be obtained by an embodiment of the invention but if these are relatively small that will be acceptable. The same applies if some radiation contributing to imaging passes through the pupil plane outside the region of interest. Therefore approximations can be used to determine the region of interest. It is also possible to determine the region of interest by the application of simple predetermined rules or manually. For example, for imaging a pattern comprising predominantly lines extending in a single direction, the region of interest may be determined by mapping the illumination distribution into the pupil plane PP-PS, which is generally a simple scaling operation (one-to-one if normalized pupil planes are used), and drawing lines perpendicular to the pattern lines against the extremes of the poles of the illumination distribution.

As is known, the wavefront of a projection system can be calculated from a model or be measured and expressed as a linear combination of Zernike coefficients and polynomials. To minimize the wavefront errors according to an embodiment of the method of the invention, the wavefront of the projection beam in the pupil plane PP-PS is expressed as a set of coefficients multiplying respective ones of a set of basis functions that are orthogonal over the weighted pupil plane and the setting(s) for the adjustable element(s) AE that minimize the coefficients are determined. In many cases the number of coefficients required will be in the range of from 30 to 40, which presents a much simpler task than optimizing an array of sample points in the pupil plane, which might require 100 or more points. An example of how this can be performed is given below. In the example, the weighting of the region outside the region of interest is set to zero but it will be appreciated that the method can be extended to non-zero weighting of the region outside the region of interest. Also, the region of interest can be divided into two or more parts having different weightings, for example the small area(s) through which the zeroth order passes might be given a higher weight than other parts of the region of interest.

To obtain a set of basis functions that are orthogonal over the selected region of interest, one approach is to start with a set of orthogonal basis functions that are orthogonal over the complete (circular) pupil plane—for example circular Zernike polynomials—and convert them to orthogonal basis functions over the region of interest. This can be done by Cholesky decomposition as follows.

First, each Zernike polynomial $\psi_{unit\text{-}disc}^{orthogonal}$ is represented on a grid in the pupil by a matrix of N×N points. In this notation, the subscript index indicates the area on which the polynomial is defined and the superscript index whether or not the polynomial is orthogonal on this area. This matrix can be mapped on a vector of length $N^2$. By restricting the points to the region of interest, i.e. by deleting the points outside this region, a smaller vector is constructed, denoted $(\psi_{ROI}^{non\text{-}orthogonal})_j$ where j is the index of the respective Zernike polynomial. An overlap matrix O is built from the inner products of all these vectors:

$$O_{kl} = (\psi_{ROI}^{nonorthogonal})_k \cdot (\psi_{ROI}^{nonorthogonal})_l \quad (1)$$

where k and l run from 1 to the maximum Zernike, e.g. 37. Cholesky decomposition of this positive definite matrix gives a tridiagonal matrix R with the property:

$$R'R = O \quad (2)$$

where the prime indicates transpose. From this it can be seen that the new orthogonal basis vectors are given by:

$$(\psi_{ROI}^{orthogonal}) = (R')^{-1} \cdot (\psi_{ROI}^{non\text{-}orthogonal}) \quad (3)$$

As an alternative, a QR-decomposition can be used.

Then, the wavefront over the region of interest, which can be calculated from a model of the optical system, can be expressed as a linear combination of coefficients $Z_{ROI,j}$ and the new orthogonal basis functions $\psi_{ROI,j}$ as follows:

$$\text{wavefront} = \sum_j Z_{ROI,i} \cdot (\psi_{ROI})_j = \sum_j Z_j (\psi_{ROI}^{non\text{-}orthogonal})_j \quad (4)$$

To optimize the wavefront over the region of interest, it is necessary to determine adjustments to the optical system to reduce the coefficients $Z_{ROI,i}$ to a small value or zero. The RMS phase error of the wavefront over the region of interest will then also be small or zero.

The coefficients $Z_{ROI,j}$ can be determined via:

$$Z_{ROI} = Z \cdot R' \quad (5)$$

where $Z_{ROI}$ and $Z$ are vectors formed from the coefficients $Z_{ROI,j}$ and $Z_j$ respectively. If the projection system has control inputs ("knobs") corresponding to the Zernike polynomials, the coefficients $Z_{ROI,j}$ can be adjusted by application of these values.

To prove the validity of this approach, the method has been applied to a circular region of interest smaller than the unit disc and an annular region of interest. In both cases the Cholesky matrix can be determined both numerically and analytically, giving identical results. It will also be appreciated that the same approach can be applied using other basis functions, such as annular Zernike polynomials, as a starting point.

To apply the method with a generalized weight function W, equation (1) can simply be changed to:

$$O_{kl} = (\psi_{ROI}^{nonorthogonal})_k \cdot W \cdot (\psi_{ROI}^{nonorthogonal})_l \quad (6)$$

Figure 4:
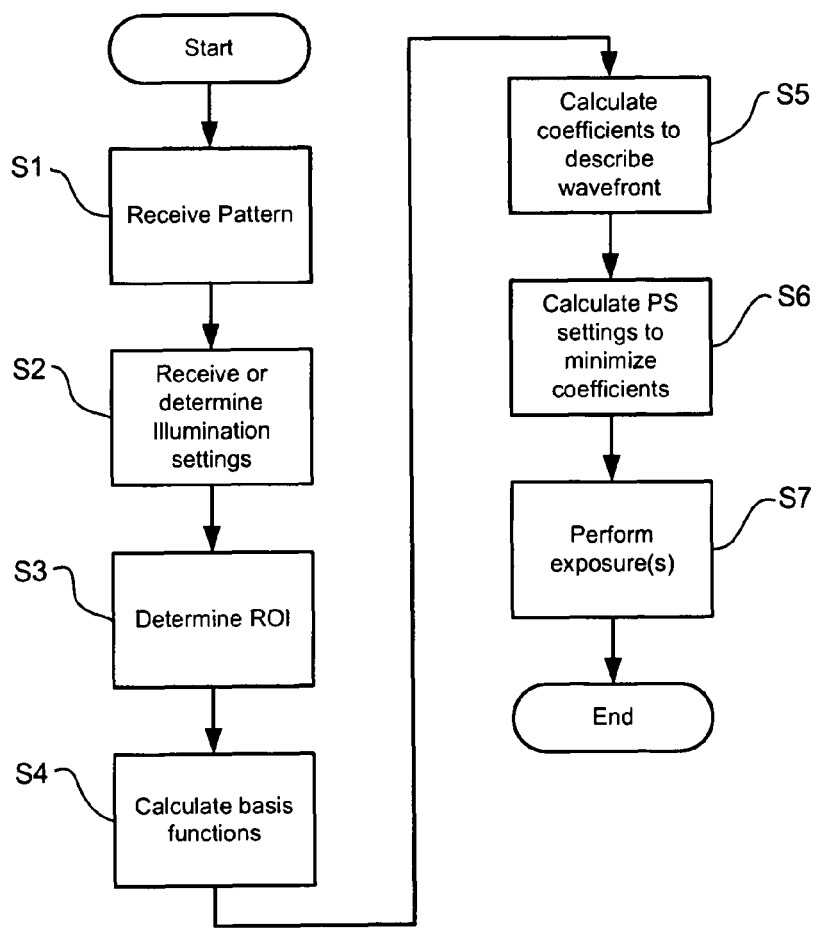
FIG. 4 depicts a method according to an embodiment of the invention.
Figure 5:
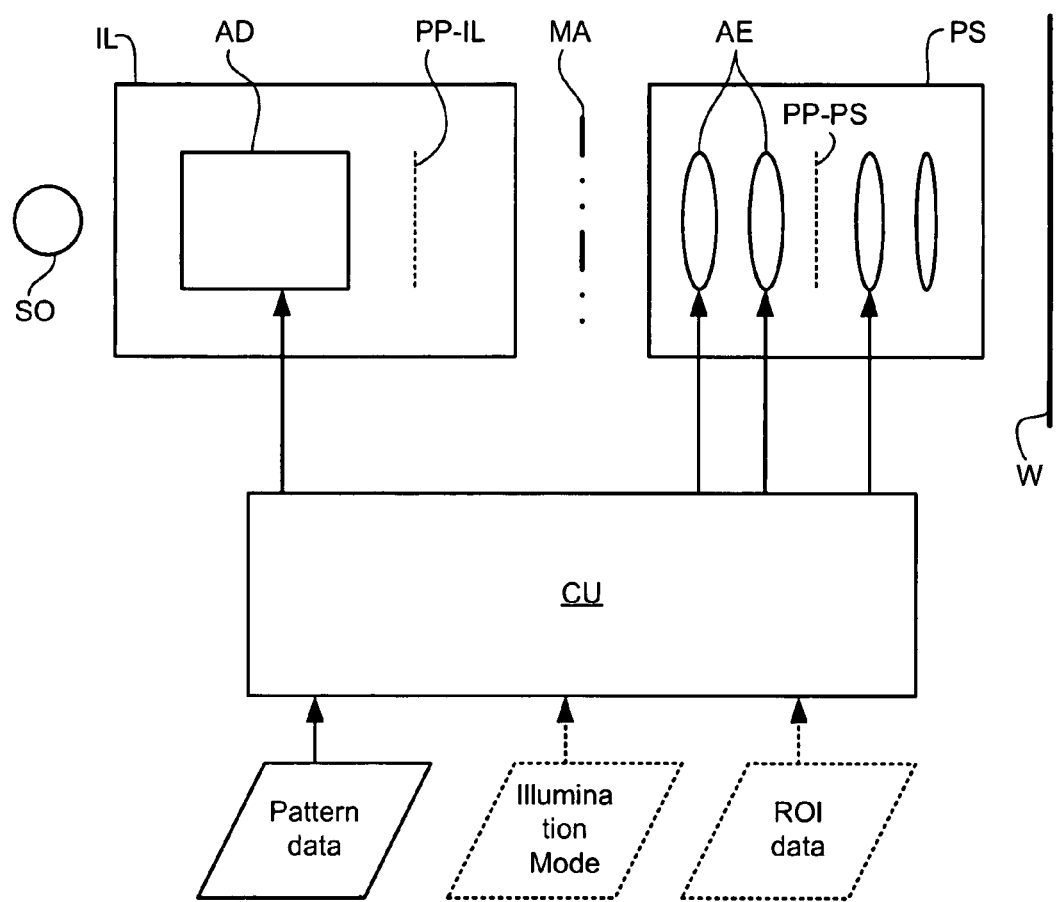
FIG. 5 depicts control and optical arrangements of the apparatus of FIG. 1.

A method of device manufacturing according to an embodiment of the present invention is shown in FIG. 4 and an apparatus for performing this method is shown in FIG. 5. This method comprises steps of:

receiving S1 data of the pattern to be imaged at a control unit CU;

receiving or determining S2 appropriate illumination settings—the illumination settings may be input by a user or determined by the control unit CU;

determining S3 the region of interest—again this may be input by a user or determined by the control unit by simulation or application of predetermined rules;

calculate S4 basis functions for the region of interest in the control unit CU;

calculate S5 coefficients to describe the wavefront over the region of interest in the control unit CU;

determine S6 settings for at least one adjustable element AE of the projection system PS; and performing an exposure S7 using the determined settings.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC; so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. Further, an embodiment of the invention may take the form one or more hardware and/or software devices configured to practice one or more of the methods according to an embodiment of the invention.

The descriptions above are intended to be illustrative, not limiting. Thus, it will be apparent to one skilled in the art that modifications may be made to the invention as described without departing from the scope of the claims set out below.

The invention claimed is:

1. A device manufacturing method using a lithographic apparatus comprising:

an illuminator configured to illuminate a patterning device with a radiation beam having an illumination arrangement, and a projection system configured to project radiation in a modulated beam to form an image of the pattern onto a substrate, the projection system having a pupil plane and an adjustable element configured to adjust an aberration of the projection system in response to a control setting, the method comprising:

receiving information regarding the pattern and the illumination arrangement;

determining a region of interest based on the information regarding the pattern and the illumination arrangement using a non-transitory computer system comprising a computer program to execute the determining, the region of interest being a non-circular region of the pupil plane through which substantially all of the radiation of the modulated beam that contributes to formation of the image passes;

obtaining a set of basis functions that are orthogonal over the region of interest;

expressing the wavefront in the pupil plane in terms of the basis functions that are orthogonal over the region of interest and a set of coefficients; and determining a value of the control setting to minimize the values of the coefficients.

2. The method of claim 1, wherein the obtaining a set of basis functions that are orthogonal over the region of interest comprises constructing a set of basis functions that are orthogonal over the region of interest based on a set of basis functions that are orthogonal over the entire pupil plane.

3. The method of claim 2, wherein the constructing a set of basis functions that are orthogonal over the region of interest comprises performing a Cholesky decomposition.

4. The method of claim 2, wherein the constructing a set of basis functions that are orthogonal over the region of interest comprises performing a QR-decomposition.

5. The method of claim 2, wherein the set of basis functions that are orthogonal over the entire pupil plane is a set of Zernike polynomials.

6. The method of claim 1, wherein the determining a value of the control setting comprises multiplying the coefficients by a triangular scaling matrix.

7. The method of claim 1, wherein the determining a value of the control setting comprises determining a value of the control setting to minimize the root mean square of the coefficients.

8. The method of claim 1, wherein the region of interest does not include parts of the pupil plane through which substantially no radiation of the modulated beam that contributes to formation of the image passes.

9. The method of claim 1, wherein the determining the region of interest comprises applying predetermined rules referring to the information regarding the pattern and the illumination arrangement.

10. A device manufacturing method using a lithographic apparatus comprising:

an illuminator configured to illuminate a patterning device with a radiation beam having an illumination arrangement, and a projection system configured to project radiation in a modulated beam to form an image of the pattern onto a substrate, the projection system having a pupil plane and an adjustable element configured to adjust an aberration of the projection system in response to a control setting, the method comprising:

receiving information regarding the pattern and the illumination arrangement;

determining a region of interest based on the information regarding the pattern and the illumination arrangement using a non-transitory computer system comprising a computer program to execute the determining, the region of interest being a non-circular region of the pupil plane through which substantially all of the radiation of the modulated beam that contributes to formation of the image passes;

determining a weighting function for the pupil plane, the weighting function weighting the region of interest higher than parts of the pupil plane not in the region of interest;

obtaining a set of basis functions that are orthogonal over the weighted pupil plane;

expressing the wavefront in the pupil plane in terms of the basis functions that are orthogonal over the weighted pupil plane and a set of coefficients; and determining a value of the control setting to minimize the values of the coefficients.

11. The method of claim 10, wherein the weighting function applies respective different weights to at least two parts of the region of interest.

12. The method of claim 10, wherein the weighting function applies a zero weight to parts of the pupil plane not in the region of interest.

13. The method of claim 10, wherein the weighting function applies a non-zero weight to parts of the pupil plane not in the region of interest.

14. A non-transitory computer readable storage medium comprising a computer program recorded thereon, the computer program configured to cause a computer system to determine a value for a control setting for a device manufacturing method using a lithographic apparatus comprising:

an illuminator configured to illuminate a patterning device with a radiation beam having an illumination arrangement, and a projection system configured to project radiation in a modulated beam to form an image of the pattern onto a substrate, the projection system having a pupil plane and an adjustable element configured to adjust an aberration of the projection system in response to a control setting, the computer program comprising instructions to instruct the computer system to perform a method comprising:

receiving information regarding the pattern and the illumination arrangement;

determining a region of interest based on the information regarding the pattern and the illumination arrangement, the region of interest being a non-circular region of the pupil plane through which substantially all of the radiation of the modulated beam that contributes to formation of the image passes;

obtaining a set of basis functions that are orthogonal over the region of interest;

expressing the wavefront in the pupil plane in terms of the basis functions that are orthogonal over the region of interest and a set of coefficients; and determining a value of the control setting to minimize the values of the coefficients.

15. A lithographic apparatus comprising:

an illuminator configured to illuminate a patterning device with a radiation beam having an illumination arrangement;

a projection system configured to project radiation in a modulated beam to form an image of the pattern onto a substrate, the projection system having a pupil plane and an adjustable element configured to adjust an aberration of the projection system in response to a control setting; and a control system comprising:

an input device arranged to receive information regarding the pattern and the illumination arrangement, a first calculating device arranged to determine a region of interest based on the information regarding the pattern and the illumination arrangement, the region of interest being a non-circular region of the pupil plane through which substantially all of the radiation of the modulated beam that contributes to formation of the image passes, a second calculating device arranged to obtain a set of basis functions that are orthogonal over the region of interest, a third calculating device arranged to express the wavefront in the pupil plane in terms of the basis functions that are orthogonal over the region of interest and a set of coefficients, and a fourth calculating device arranged to determine a value of the control setting to minimize the values of the coefficients.

* * * * *